(12) United States Patent
Rosmeulen (10) Patent No.: US 11,769,563 B2
(45) Date of Patent: Sep. 26, 2023

(54) LIQUID ELECTROCHEMICAL MEMORY DEVICE

(71) Applicant: IMEC vzw, Leuven (BE)

(72) Inventor: Maarten Rosmeulen, Ghent (BE)

(73) Assignee: IMEC vzw, Leuven (BE)

(*) Notice: Subject to any disclaimer, the term of this patent is extended or adjusted under 35 U.S.C. 154(b) by 17 days.

(21) Appl. No.: 17/562,778

(22) Filed: Dec. 27, 2021

(65) Prior Publication Data

US 2022/0208292 A1    Jun. 30, 2022

(30) Foreign Application Priority Data

Dec. 28, 2020 (EP) ..................................... 20217465

(51) Int. Cl.
*G11C 25/00* (2006.01)
(52) U.S. Cl.
CPC ..................................... *G11C 25/00* (2013.01)
(58) Field of Classification Search
CPC ................ G11C 25/00; G11C 11/5614; G11C 2013/005; G11C 13/004; G11C 13/0069; G11C 13/0009; G11C 13/02
See application file for complete search history.

(56) References Cited

U.S. PATENT DOCUMENTS

| | | |
|---|---|---|
| 2004/0017694 A1 | 1/2004 | Radominski et al. |
| 2005/0207208 A1 | 9/2005 | Bocian et al. |
| 2005/0270822 A1 | 12/2005 | Shrivastava et al. |
| 2006/0209495 A1 | 9/2006 | Lee et al. |
| 2008/0031043 A1 | 2/2008 | Aochi et al. |
| 2009/0231907 A1* | 9/2009 | Bloch ..................... G11C 13/02 365/153 |
| 2010/0140582 A1 | 6/2010 | Nessel et al. |
| 2013/0182520 A1 | 7/2013 | McCreery et al. |
| 2020/0350440 A1 | 11/2020 | Gao et al. |

FOREIGN PATENT DOCUMENTS

| | | | | |
|---|---|---|---|---|
| CA | 2801507 A1 | * | 7/2013 | ......... G11C 13/0016 |
| EP | 1892723 A1 | * | 2/2008 | ............. G11C 13/02 |
| JP | 2009224776 A | * | 10/2009 | ............. G11C 13/02 |

OTHER PUBLICATIONS

Extended European Search Report dated Jun. 23, 2021 in European Application No. 20217465.2, 9 pages.
V. N. Ur'ev et al., Electrochemical Memory Cells, Russian Journal of Electrochemistry 36 (2000) pp. 1265-1267.

* cited by examiner

*Primary Examiner* — Jay W. Radke
(74) *Attorney, Agent, or Firm* — Knobbe, Martens, Olson & Bear, LLP (57) ABSTRACT

A liquid electrochemical memory device is provided. In one aspect, the device includes a memory region for storing at least two bits, the memory region having a first volume; and a liquid electrolyte region fluidically connected to the memory region, the liquid electrolyte region having a second volume larger than the first volume. The device further includes a working electrode exposed to the memory region, and a counter electrode exposed to the liquid electrolyte region. The device also includes an electrolyte filling the memory region and the liquid electrolyte region, in physical contact with the working electrode and the counter electrode, the electrolyte including at least two conductive species. The device further includes a control unit for biasing the working electrode and the counter electrode.

20 Claims, 4 Drawing Sheets

LIQUID ELECTROCHEMICAL MEMORY DEVICE

CROSS-REFERENCE TO RELATED APPLICATIONS

This application claims foreign priority to European Patent Application No. 20217465.2, filed Dec. 28, 2020, which is incorporated by reference herein in its entirety.

BACKGROUND

Technological Field

The disclosed technology relates to memory devices. More specifically, the disclosed technology relates to a liquid electrochemical memory device, methods for writing to and reading from the liquid electrochemical memory device, and to a method for producing the liquid electrochemical memory device.

Description of the Related Technology

Over the past decades, hard disk drives have been applied as main data storage medium, that is, nonvolatile memory, in, for example, mobile phones, personal computers, and data centers. More recently, NAND-type flash memory devices, that is, NAND devices, have progressively been replacing hard disk drives in such applications. This replacement has been enabled by the small dimensions and high data rates of the NAND devices.

Non-volatile memory devices such as hard disk drives and NAND devices attain high densities by packing identical memory cells in dense two- or three-dimensional memory arrays. The memory cells are connected to a dense net of conductor lines that run in different directions across the memory array. Herein, in general, each memory cell consists of two elements. A first element is a storage element that stores one or more bits of information by altering a physical state of a material contained in the storage element. This may include a change in electrostatic charge, a change in magnetic or ferroelectric polarization or switching between amorphous and crystalline phases. The second element is an addressing element that connects the storage element to the conductor net. The addressing element ensures that each memory cell can be addressed individually for reading, writing, and erasing of information. Herein, data in a memory cell is addressed so that data stored in different memory cells that are connected to the same conductor grid is not disturbed. Typically, the addressing elements include a transistor or a diode. Typically, only 1 bit is stored in each memory cell.

Increasing the bit density of the nonvolatile memory requires reducing the dimensions of both the storage elements and addressing elements of the nonvolatile memory. The biggest challenge for scaling high-density memories is reducing the size of the addressing element and increasing the number of bits stored in each memory cell. NAND devices have, at present, attained the highest densities of all-solid-state memories because of their very compact addressing element at the limits of manufacturing resolution and storage of up to 4 bits per cell. Whereas storage elements can be envisaged that are smaller than what is achievable with electrostatic storage used in NAND devices, there is currently no known alternative addressing element that can be made more compact than NAND devices in a cost-effective way. A way to increase bit density is therefore to increase the number of bits that may be stored in each memory cell.

V. N. Ur'ev et al., Electrochemical Memory Cells, Russian Journal of Electrochemistry 36 (2000) pp. 1265-1267, proposed a memory cell. Multiple bits may be stored in a single memory cell. Therein, the memory cell includes a working electrode, a counter electrode, and a liquid electrolyte between the working electrode and the counter electrode. The liquid electrolyte includes two ions, for example, copper ions and tin ions. Data is written by electrodeposition, wherein the ions are reduced and deposited over the working electrode. For instance, on application of a first cathodic potential $E_1$, a first layer including a metal with the relatively higher electrode potential, for example copper, is deposited. For instance, on the application of a second cathodic potential $E_2 < E_1$, a second layer including an alloy, for example a copper-tin alloy, is deposited. A thickness of a deposited layer may depend on a duration of an applied potential. A first layer and/or a second layer may be deposited or a plurality of first layers along with a plurality of second layers may be deposited. For instance, a first thickness of the first layers may correspond to a logic zero, and a second thickness of the first layers may correspond to logic unity (a logic one). Similarly, a first thickness of the second layers may correspond to a logic zero, and a second thickness of the second layers may correspond to logic unity. Herein, the first thickness and the second thickness of the first layers may be different from the first thickness and the second thickness of the second layers. Thereby, a stack including alternating first and second layers, wherein the first and second layers have a different composition, and wherein the layers have different thicknesses, may be deposited over the working electrode. This stack may correspond to stored binary data. The stored data may be read by electro-dissolution, wherein an anodic potential is applied to the working electrode so that the layers dissolve. Herein, the electro-dissolution is performed from the top layer of the stack and downward. By sensing a current flow through the working electrode as a function of time, the stored data may be read.

A drawback of the memory cell proposed by V. N. Ur'ev et al., is that a rate of writing data is, at present, limited. For instance, on writing, the ionic concentration of the liquid electrolyte reduces, thereby reducing the rate of writing data. Furthermore, diffusion of the ions of the liquid electrolyte may be a factor limiting the rate of writing data.

There is a need in the art for a memory device that solves one or more of the issues raised above.

SUMMARY OF CERTAIN INVENTIVE ASPECTS

Embodiments of the disclosed technology provide a liquid electrochemical memory device.

The above and other objectives may be accomplished by methods and devices according to the disclosed technology.

It is an advantage of certain embodiments of the disclosed technology that the liquid electrochemical memory device includes a memory region where at least two bits may be stored. It is an advantage of certain embodiments of the disclosed technology that the liquid electrochemical memory device includes a single element for reading and writing the at least two bits. Therefore, advantageously, in certain embodiments of the disclosed technology, the bit density may be large compared to contemporary commercial nonvolatile memory devices.

It is an advantage of certain embodiments of the disclosed technology that a concentration of ions in the electrolyte may not reduce significantly on deposition of the ions on a working electrode, that is, during writing of data. It is an advantage of certain embodiments of the disclosed technology that a rate of writing data in the liquid electrochemical memory device remains similar, for example large, even after writing a plurality of bits in the memory region.

It is an advantage of certain embodiments of the disclosed technology that a potential that needs to be applied for addressing data in the liquid electrochemical memory device may be low. It is an advantage of certain embodiments of the disclosed technology that a power consumption of the liquid electrochemical memory device may be low. It is an advantage of certain embodiments of the disclosed technology that a retention of stored data may be very good.

In a first aspect, the disclosed technology relates to a liquid electrochemical memory device including a memory region for storing at least two bits, the memory region having a first volume, a liquid electrolyte region fluidically connected to the memory region, the liquid electrolyte region having a second volume larger than the first volume, a working electrode exposed to the memory region, a counter electrode exposed to the liquid electrolyte region, an electrolyte filling the memory region and the liquid electrolyte region, in physical contact with the working electrode and the counter electrode, the electrolyte including at least two conductive species, and a control unit for biasing the working electrode and the counter electrode.

In a second aspect, the disclosed technology relates to a method for writing data in a liquid electrochemical memory device according to embodiments of the first aspect, the method including electrodepositing at least one of the two conductive species from the electrolyte, thereby creating at least a bit of the memory cell.

In a third aspect, the disclosed technology relates to a method for reading data in a liquid electrochemical memory device according to embodiments of the first aspect, the method including: applying bias or current conditions to the working and counter electrodes so as to electro-dissolve material from the working electrode; and monitoring the amount of charge flowing through the working electrode or the voltage appearing at the working electrode during electro-dissolving.

In a fourth aspect, the disclosed technology relates to a method for producing a liquid electrochemical memory device according to certain embodiments of the first aspect, including: providing a memory region for storing at least two bits, the memory region having a first volume, and a working electrode exposed to the memory region, providing a liquid electrolyte region fluidically connected to the memory region, the liquid electrolyte region having a second volume larger than the first volume, and a counter electrode exposed to the liquid electrolyte region, providing an electrolyte in the memory region and in the liquid electrolyte region, the electrolyte including at least two conductive species, hermetically sealing the memory region and the liquid electrolyte region, and providing a control unit for biasing the working electrode and the counter electrode.

Particular aspects of the disclosed technology are set out in the accompanying independent and dependent claims. Features from the dependent claims may be combined with features of the independent claims and with features of other dependent claims as appropriate and not merely as explicitly set out in the claims.

Embodiments of the disclosed technology can provide more efficient, stable, and reliable liquid electrochemical memory devices.

The above and other characteristics, features, and advantages of the disclosed technology will become apparent from the following detailed description, taken in conjunction with the accompanying drawings, which illustrate, by way of example, the principles of the disclosed technology. This description is given for the sake of example only, without limiting the scope of the disclosed technology. The reference figures quoted below refer to the attached drawings.

In the different figures, the same reference signs refer to the same or analogous elements.

DETAILED DESCRIPTION OF CERTAIN ILLUSTRATIVE EMBODIMENTS

The disclosed technology will be described with respect to particular embodiments and with reference to certain drawings, but the disclosed technology is not limited thereto. The drawings described are only schematic and are non-limiting. In the drawings, the size of some of the elements may be exaggerated and not drawn on scale for illustrative purposes. The dimensions and the relative dimensions do not correspond to actual reductions to practice of the disclosed technology.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the disclosed technology described herein are capable of operation in other sequences than described or illustrated herein.

Moreover, the terms top, bottom, over, under, and the like in the description and the claims are used for descriptive purposes and not necessarily for describing relative positions. It is to be understood that the terms so used are interchangeable under appropriate circumstances and that the embodiments of the disclosed technology described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps or components, or groups thereof. The term "comprising" therefore covers the situation where only the stated features are present and the situation where these features and one or more other features are present. The word "comprising" according to the disclosed technology therefore also includes as one embodiment that no further components are present. Thus, the scope of the expression "a device comprising components A and B" should not be interpreted as being limited to devices consisting only of components A and B. It means that with respect to the disclosed technology, the only relevant components of the device are A and B.

Similarly, it is to be noticed that the term "coupled", also used in the claims, should not be interpreted as being restricted to direct connections only. The terms "coupled" and "connected", along with their derivatives, may be used. It should be understood that these terms are not intended as synonyms for each other. Thus, the scope of the expression "a device A coupled to a device B" should not be limited to devices or systems wherein an output of device A is directly connected to an input of device B. It means that there exists a path between an output of A and an input of B which may be a path including other devices or means. "Coupled" may mean that two or more elements are either in direct physical or electrical contact, or that two or more elements are not in direct contact with each other but yet still co-operate or interact with each other.

Reference throughout this specification to "one embodiment" or "an embodiment" means that a particular feature, structure or characteristic described in connection with the embodiment is included in at least one embodiment of the disclosed technology. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the disclosed technology, various features of the disclosed technology are sometimes grouped together in a single embodiment, figure, or description thereof for the purpose of streamlining the disclosure and aiding in the understanding of one or more of the various aspects of the disclosed technology. This method of disclosure, however, is not to be interpreted as reflecting an intention that the disclosed technology requires more features than are expressly recited in each claim. Rather, as the following claims reflect, aspects of the disclosed technology lie in less than all features of a single foregoing disclosed embodiment. Thus, the claims following the detailed description are hereby expressly incorporated into this detailed description, with each claim standing on its own as a separate embodiment of this disclosed technology.

Furthermore, while some embodiments described herein include some but not other features included in other embodiments, combinations of features of different embodiments are meant to be within the scope of the disclosed technology, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out the disclosed technology.

In the description provided herein, numerous specific details are set forth. However, it is understood that embodiments of the disclosed technology may be practiced without these specific details. In other instances, well-known methods, structures, and techniques have not been shown in detail in order not to obscure an understanding of this description.

In a first aspect, the disclosed technology relates to a liquid electrochemical memory device including a memory region for storing at least two bits, the memory region having a first volume, a liquid electrolyte region fluidically connected to the memory region, the liquid electrolyte region having a second volume larger than the first volume, a working electrode exposed to the memory region, a counter electrode exposed to the liquid electrolyte region, an electrolyte filling the memory region and the liquid electrolyte region, in physical contact with the working electrode and the counter electrode, the electrolyte including at least two conductive species, and a control unit for biasing the working electrode and the counter electrode.

In embodiments, the memory region has a first width, perpendicular to a direction from the working electrode to the counter electrode, and the liquid electrolyte region has a second width, perpendicular to the direction, wherein the second width is larger than the first width. Thereby, the volume of the liquid electrolyte region can be relatively large, whereas the distance between the working electrode and the counter electrode remains relatively small.

In embodiments, each layer corresponds to a bit. In embodiments, each layer is present over the working electrode, for example over a surface of the working electrode exposed to the memory region. Herein, each layer may be over part of the working electrode, or over a complete surface of the working electrode. In embodiments, each layer may be either a first layer (having a first composition) or a second layer (having a second composition, different from the first composition). However, the disclosed technology is not limited thereto and there may also be further layers having further compositions, different from the first and the second composition). Each layer may include at least one of the two conductive species. The two conductive species are a first conductive species and a second conductive species. However, this disclosed technology is not limited thereto, and the at least two conductive species may include further conductive species such as a third conductive species. Herein, the conductive species of the layers may have been deposited (for example, by reduction) from the electrolyte. That is, the at least two conductive species may be in ionic form in the electrolyte and the at least two conductive species may be in metallic form in the layers.

In embodiments, there may be at least one first layer and/or at least one second layer, wherein each first layer may include a first ratio of the first conductive species to the second conductive species. In embodiments, each second layer may include a second ratio of the first conductive species to the second conductive species, the second ratio being different from the first ratio. In embodiments, each of the first layers may be present with either a first thickness or a second thickness, different from the first thickness. In embodiments, one of the first thickness and the second thickness of the first layers may be 10% larger, 50% larger, or 100% larger than the other of the first thickness and the second thickness. For instance, a first thickness of the first layers may correspond to a logic zero, and a second thickness of the first layers may correspond to a logic unity (a logic one), thereby enabling a binary numerical system. In embodiments, each of the second layers may be present with either a first thickness or a second thickness, different from the first thickness. In embodiments, one of the first thickness and the second thickness of the second layers is 10% larger, 50% larger, or 100% larger than the other of the first thickness and the second thickness. In embodiments, a first thickness of the second layers may correspond to a logic zero, and a second thickness of the second layers may correspond to a logic unity, thereby enabling a binary numerical system. In embodiments, the liquid electrochemical memory device includes a stack of alternating first layers and second layers over the working electrode. Herein, each layer of the stack of layers may correspond to a bit. Therefore, the stack of alternating first layers and second layers may correspond to stored data. That is, memory data may be stored in the memory region by a stack of alternating first layers and second layers. However, the disclosed technology is not limited to this way of encoding data. Also, other ways of encoding data in the stack may be envisaged. For example, each layer may encode more than a single binary number by depositing layers with a plurality of thicknesses. For example, when a layer can have four different thicknesses, the layer may correspond to two binary numbers at the same time. For example, when a layer can have eight different thicknesses, the layer may correspond to three binary numbers at the same time. In another example, the thickness of the first layer may be modulated to code for a binary number, whereas the thickness of the second layer may be always the same. In that case, the second layer serves as a separator between adjacent first layers, that is, bits.

The stored data may be read by electro-dissolution, for example by applying bias or current conditions to the working and counter electrodes so as to electro-dissolve material from the working electrode. Herein, the electro-dissolution may be performed from the top layer of the stack and downward. As the layers include conductive species, the layers themselves may also be conductive. In embodiments, the first layers and the second layers are conductive. Thereby, a voltage or current condition applied to the working electrode is also applied to a top layer of the stack. In embodiments, only a top layer of the stack is exposed to the electrolyte present in the memory region. By monitoring the amount of charge flowing through the working electrode or the voltage appearing at the working electrode, or in other words, by sensing a current flowing through the working electrode, an amount of charge flowing through the working electrode, or a potential level at the working electrode, as a function of time on electro-dissolution, the stored data may be read. Advantageously, as the layers of the stack may be conductive, further layers may be deposited over the stack, for example on top of the stack.

In embodiments, the at least two conductive species have a different electrode potential. Advantageously, in these embodiments, a first layer deposited at a first potential may have a different ratio of the first conductive species to the second conductive species than a second layer deposited at a second potential. In embodiments, the conductive species are metallic species, that is, a metal ion in the electrolyte, and a metal after deposition. In embodiments, one of the conductive species (for example, the first conductive species) is copper and another of the conductive species (for example, the second conductive species) is cobalt, tin or nickel. This is advantageous because the difference in the electrode potential between copper, and any of cobalt, tin, and nickel is relatively large. Thereby, a difference in the ratio of the first conductive species to the second conductive species between the first layer and the second layer may easily be made large as well. As a result, the relatively large difference in ratio may result in a relatively larger difference in current through or potential level at the working electrode between electrodissolution of the first layer and of the second layer. Advantageously, the large difference in electrode potential may facilitate reading of the stored data.

In embodiments, the liquid electrochemical memory device includes a reference electrode contacting the electrolyte. The reference electrode may be exposed to the liquid electrolyte region. In embodiments, the reference electrode consists of an inert material, such as carbon.

In embodiments, the electrolyte includes water. Advantageously, water is a good solvent for conductive species. Advantageously, water is a cheap and safe material. In different embodiments, the electrolyte is a non-water-based electrolyte. Advantageously, in these embodiments, corrosion of elements of the liquid electrochemical memory device, for example of the layers, that is, of the data stored in the liquid electrochemical memory device, may be limited. In embodiments, the electrolyte may have a water concentration and oxygen concentration lower than 100 ppm, lower than about 50 ppm, or lower than 10 ppm. In embodiments, the non-water-based electrolyte includes an ionic liquid. Advantageously, ionic liquids may have a very low vapour pressure, so that production of the liquid electrochemical device in a vacuum environment is possible. The vacuum environment may be used during the production of the memory device (such as, for example, for certain deposition techniques such as physical vapor deposition). Furthermore, ionic liquids may have a high thermal stability and a high conductivity. In embodiments, the ionic liquid is liquid at at least a temperature in the range of from 0° C. to 70° C. In embodiments, the ionic liquid electrolyte includes a phosphate. An advantage of ionic liquids is that a concentration of conductive species therein may be very high. Therefore, advantageously, on electrodeposition of the conductive species over the working electrode, the concentration of conductive species may not be significantly reduced. Advantageously, thereby, a rate of deposition of the conductive species may remain the same, even after deposition of multiple bits, for example layers including the conductive species.

In embodiments, the memory region is adapted for storing at least two bits. In embodiments, the memory region for storing at least two bits means that the memory region includes space suitable for storing the at least two bits. In embodiments, the memory region is sufficiently large for including at least two layers. In embodiments, a thickness of each of the layers is from single-atom thickness up to 10 µm, from 1 nm to 100 nm, or from 1 nm to 20 nm. The thinner a layer is, the faster writing and reading of data can be. Furthermore, the thinner a layer is, the less power or energy may be required for electrodepositing or electro-dissolving the layer. However, advantageously, thicker layers may be more stable and may provide a larger resolution to distinguish between first and second layers, that is, during reading of data. In embodiments, the memory region has a width of from 1 nm to 1000 nm, or from 10 to 100 nm. In embodiments, the width is perpendicular to a direction from the working electrode to the counter electrode. In embodiments, the memory region has a height, parallel to a direction from the working electrode to the counter electrode, of from 1 nm to 100 µm, or from 1 µm to 10 µm. In embodiments, a width of each of the layers is from 1 nm to 1000 nm, or from 10 nm to 100 nm. Advantageously, when a layer has a small width, a current required to electrodeposit or electro-dissolve the layer may be smaller. Furthermore, advantageously, smaller dimensions of the layers may increase the bit density of the liquid electrochemical memory device.

A shape of the memory region may be any shape. That is, the memory region may have any shape suitable for including the at least two bits. In embodiments, the memory region includes a container, such as a channel. In embodiments, the working electrode is at a first side of the container, such as at a first end of the channel, and the container is fluidically connected to the liquid electrolyte region at a second side of the container, such as at a second end of the channel, opposite to the first side. In embodiments, the first side is completely covered by the working electrode. Advantageously, in these embodiments, the width of the layers over the working electrode is limited by the width of the container, wherein the width is parallel to the surface of the working electrode. Thereby, the width of the layers and the amount of deposited material may be controlled. Furthermore, advantageously, in these embodiments, the width of each of the layers may be the same, that is, the layers may have a uniform width. Advantageously, the uniform width may result in a uniform rate of electrodeposition and electro-dissolution of the layers. In embodiments, a surface of the working electrode exposed to the memory region is flat. Advantageously, if the working electrode is flat, a layer electrodeposited over the working electrode may be flat and uniform, which may improve controllability of the reading and the writing of bits.

In embodiments, the second width, perpendicular to a direction from the working electrode to the counter electrode, of the liquid electrolyte region is larger than the first width, perpendicular to the direction from the working electrode to the counter electrode, of the memory region. In embodiments, the second width is at least 10% larger, such as at least 100% larger, than the first width. In embodiments, the first width is the width of the exposed surface of the working electrode. In embodiments, the first width is equal to the width of the bits, that is, of the stack of layers. In embodiments including the container, the first width equals the distance between two opposing walls of the container. In embodiments, the second width equals the distance between two opposite walls of the liquid electrolyte region. Advantageously, as the second width may be large, the volume of the liquid electrolyte region may be relatively large. Furthermore, as the first width may be small, the amount of conductive species that needs to be deposited to form a bit (for example a layer with a particular thickness) is relatively small, as the area of the bit may be small.

In embodiments, the liquid electrolyte region includes a container. The shape of the container may be any shape. In certain embodiments, the container has a cuboid shape, such as a rectangular cuboid shape. In embodiments, the liquid electrolyte region is located between the memory region and the counter electrode. In embodiments, the liquid electrolyte region has a height, parallel to a direction from the working electrode to the counter electrode, of from 1 nm to 50 µm, or from 1 µm to 5 µm. In certain embodiments, the height of the liquid electrolyte region is smaller than the height of the memory region. For instance, the height of the liquid electrolyte region may be from 10 to 90% of the height of the memory region. In embodiments, the width of the liquid electrolyte region is from 1 nm to 100 µm, or from 10 nm to 10 µm. In embodiments, the second volume is from 10 $nm^3$ to 1000 $\mu m^3$, from $10^3$ $nm^3$ to 100 $\mu m^3$, or from $10^5$ $nm^3$ to 10 $\mu m^3$. The second volume of the liquid electrolyte region is larger than the first volume of the memory region. In embodiments, the first volume is from 10 $nm^3$ to 100 $\mu m^3$, from $10^3$ $nm^3$ to 10 $\mu m^3$, or from $10^5$ $nm^3$ to 1 $\mu m^3$. For instance, the first volume may be from 10% to 90% of the second volume. In certain embodiments, the volume of the liquid electrolyte region is larger than the added volume of all the memory regions fluidically coupled to the liquid electrolyte region. For instance, the first volume may be from 10% to 90% of the added volume of all the memory regions fluidically coupled to the liquid electrolyte region. Advantageously, the second volume of the liquid electrolyte may be large so that, on deposition of conductive species from the liquid electrolyte, the concentration of conductive species is not significantly changed. Thereby, advantageously, a rate of deposition may be constant even after deposition of a plurality of layers. At the same time, even though the second volume of the liquid electrolyte region may be relatively large, a distance between the working electrode and the counter electrode may remain relatively small. In embodiments, the distance between the working electrode and the counter electrode is from 0.1 µm to 100 µm, or from 1 to 10 µm. A small distance between the working electrode and the counter electrode may improve a rate of electrodeposition of conductive species in the memory region. For example, in these embodiments, a distance a conductive species may have to cover while moving from the counter electrode to the working electrode may be small. In embodiments, the liquid electrochemical memory device includes a plurality of memory regions, each for storing at least two bits, and a corresponding number of working electrodes, each exposed to a different memory region. In embodiments, each of the plurality of memory regions may be fluidically connected to a different liquid electrolyte region. In these embodiments, the liquid electrolyte regions of neighbouring memory regions may not be fluidically coupled to each other. In certain embodiments, the liquid electrolyte region includes a single liquid electrolyte region fluidically coupled to the plurality of memory regions. In these embodiments, a large second volume for the liquid electrolyte region may be combined with a large bit density. In these embodiments, the second width may be larger than the first width of each of the plurality of memory regions combined. For instance, the first width of each of the plurality of memory regions combined may be from 10 to 90% of the width of the second width. Furthermore, the single liquid electrolyte region may facilitate manufacturing. In embodiments, the liquid electrochemical memory device includes a single counter electrode. Herein, the counter electrode may function as the counter electrode for each of the working electrodes. Advantageously, the single counter electrode may facilitate manufacturing.

In embodiments, the counter electrode includes a plurality of counter electrodes. Advantageously, in these embodiments, excessive corrosion of the counter electrode may be prevented. In embodiments, each of the plurality of counter electrodes includes a different material. In embodiments, the counter electrode includes a layer including conductive species over a layer including an inert electrode material, such as carbon. The inert electrode material may prevent damaging the counter electrode. That is, when the conductive species are electro-dissolved in the liquid electrolyte from the counter electrode, further electro-dissolution from the counter electrode may be prevented by the layer including the inert electrode material. In embodiments, the layer including the conductive species is electro-deposited from the liquid electrolyte over the layer including the inert electrode material after manufacture of the liquid electrochemical memory device.

In embodiments, the counter electrode includes the at least two conductive species. When applying appropriate voltage or current conditions to the working electrode, at least one conductive species may be electro-dissolved from the counter electrode into the liquid electrolyte. Alternatively, at least one conductive species may be electrodeposited on the counter electrode from the liquid electrolyte. Advantageously, thereby, the concentration of conductive species in the electrolyte may be controlled. Thereby, as the rate of electrodeposition of the conductive species depends on the concentration of the conductive species, the rate of electrodeposition of the conductive species in the memory region may be controlled. In embodiments, the counter electrode includes an alloyed counter electrode, that is, wherein the at least two conductive species form an alloy. In different embodiments, the counter electrode includes the at least two conductive species that are not alloyed. For instance, different regions of the counter electrode may consist of different conductive species. In these embodiments, each of the different regions may be in physical contact with the liquid. In these embodiments, different regions of the counter electrode may be electrically coupled to other regions of the working electrode. However, in particular embodiments, the different regions are each connected separately to the control unit. In other words, according to certain embodiments, the counter electrode includes a plurality of counter electrodes, wherein each of the plurality of counter electrodes includes another conductive species or another alloy of conductive species. Thereby, each of the plurality of counter electrodes may control the concentration of conductive species in the liquid electrolyte. In embodiments, the liquid electrochemical memory device includes probing electrodes for detecting a concentration of conductive species in the liquid electrolyte. For instance, when the probing electrodes detect that the concentration of conductive species in the liquid electrolyte is below a threshold, conductive species may be electro-dissolved from the counter electrodes.

In embodiments, the electrolyte includes additives for increasing a rate of electro-deposition. In embodiments, the electrolyte includes additives for increasing a rate of electro-dissolution.

In embodiments, a concentration of one of the conductive species, that is, a first conductive species, is at least ten times higher, or at least hundred times higher, than a concentration of another of the conductive species, that is, a second conductive species. In these embodiments, the first conductive species may have a lower electrode potential, that is, reduction potential, than the second conductive species. For instance, the first conductive species may have an electrode potential which is at least 0.1 V lower than the second conductive species. A higher reduction potential of a conductive species may correspond with a greater affinity of the conductive species for electrons, and with a greater tendency to be reduced. When a potential is applied to the working electrode that is below the reduction potential of a conductive species in the electrolyte, the conductive species in the electrolyte may become reduced and deposited on the working electrode. When a first potential applied to the working electrode is below the reduction potential of the second conductive species, that is, the conductive species with the higher reduction potential, but above the reduction potential of the first conductive species, only the second conductive species may be deposited, thereby possibly forming a layer consisting of the second conductive species. When a second potential applied to the working electrode is below the reduction potential of the first conductive species and of the second conductive species, the first conductive species and the second conductive species may be deposited, that is, co-deposited, thereby forming a layer including an alloy. However, it may be used to deposit or form layers that consist of one of the conductive species or that include 99% or more of a single conductive species. Pure layers may improve the uniformity of electro-dissolution. Furthermore, deposition of pure layers may avoid the formation of porous layers and layers with a rough surface. Finally, deposition of pure layers may also improve the selectivity of electro-dissolution of layers which may facilitate accurately detecting the bits stored in the memory region. To deposit relatively pure layers, use may be made of the fact that a higher concentration of conductive species in the electrolyte may result in a higher deposition rate. Therefore, when co-deposition occurs, the concentration of the conductive species in the deposited film depends on the concentration of the conductive species in the electrolyte. When the concentration of the first conductive species with the lower reduction potential is considerably higher than the concentration of the second conductive species, and when the second potential is applied, the deposited layer may mostly consist of the first conductive species. That is, even though co-deposition may occur at the second potential. Thereby, at the second potential, layers may be formed that almost purely consist of the second conductive species. At the first potential, layers may be formed that almost purely consist of the first conductive species. Thereby, a material content of the deposited layers at the first potential and the second potential is very different. In embodiments wherein a concentration of the first conductive species is much higher (for example, at least twice larger) than a concentration of the second conductive species, both at the first potential and at the second potential, relatively pure layers may be deposited. In embodiments including the stack of layers including alternating first layers and second layers, at least 90%, or at least 99%, of the first layers may be a first conductive species, and at least 90%, or at least 99%, of the second layers may be a second conductive species.

In embodiments, the liquid electrochemical memory device includes a barrier between the counter electrode and the working electrode, wherein the barrier is permeable to at least one ion and not permeable to another ion. In embodiments, the barrier is located in the liquid electrolyte region. In embodiments, the at least one ion to which the barrier is permeable includes a proton, that is, hydrogen cation. Advantageously, the barrier may prevent diffusion of the another ion to the working electrode. For example, the another ion may be electro-dissolved from the counter electrode, but it may be unwanted that the another ion is reduced and deposited on the working electrode. In embodiments, the another ion may be any ion. The barrier may in that case act as a salt bridge. In certain embodiments, the another ion includes the conductive species. Advantageously, the barrier may, for example, help to control the concentration of the conductive species that diffuses from the counter electrode to the working electrode. In embodiments, the barrier includes a membrane or a porous material. In embodiments including the barrier, the electrolyte may include a first electrolyte and a second electrolyte. Herein, the first electrolyte may physically contact the counter electrode, and the second electrolyte may physically contact the working electrode. In embodiments, the barrier separates the first electrolyte from the second electrolyte. In embodiments, the second electrode includes the conductive species. In embodiments, the first electrode does not include the conductive species.

In embodiments, the electrolyte includes protective species with an reduction potential that is higher (for example, at least 0.1 V higher) than an reduction potential of the conductive species. Before the liquid electrochemical memory device is powered down and is switched in retention mode wherein no external power source may be available, electrodes of the liquid electrochemical memory device in contact with the electrolyte may be covered by deposition of the protective species. Thereby, a protective layer may be formed over the electrodes. In embodiments, the liquid electrochemical memory device includes the protective layer over electrodes of the liquid electrochemical memory device. In embodiments, the electrodes covered by the protective layer may include the working electrode, wherein the protective layers are formed over the working electrode such as on top of the bits, that is, the stack of layers. In embodiments, the electrodes covered by the protective layer may include the counter electrode. In embodiments, the electrodes covered by the protective layer may include the reference electrode. In embodiments, the liquid electrochemical memory device includes a helping electrode including the protective species. Advantageously, in these embodiments, the protective species may be electro-dissolved from the helping electrode, into the electrolyte. Furthermore, the protective species may be electrodeposited from the electrolyte onto the helping electrode. Advantageously, in these embodiments, the electrolyte may not include the protective species during writing of bits, that is, deposition of first and second layers. Thereby, the protective species may not be deposited during the writing of bits. Advantageously, in these embodiments, the protective species may only be deposited when the liquid electrochemical memory device is switched into retention mode. The protective layer may prevent galvanic corrosion of the electrodes, which may for example occur during the retention mode. In embodiments, when the liquid electrochemical memory device is powered up again, the protective layer may be electro-dissolved from the electrodes covered by the protective layer, to form the protective species in the electrolyte. In these embodiments, the protectives species may subsequently be electrodeposited on the helping electrodes. As the protective species may have a higher electrode potential than the conductive species, selective electro-dissolution and electro-deposition of the protective species may be possible. In embodiments, the liquid electrochemical memory device includes further probing electrodes for detecting a concentration of protective species in the liquid electrolyte. For instance, when the protective species are removed from the liquid electrolyte, for example during writing of bits, the further probing electrode may detect whether the protective species are still present in the liquid electrolyte.

In embodiments, the control unit may be any control unit suitable for biasing the working electrode and the counter electrode. Herein, the biasing may include that a potential difference is applied between the working electrode and the counter electrode. The biasing may include that a current is induced to flow through an external conductor connected to the working electrode and the counter electrode. In embodiments, the control unit is connected to an external conductor connected to the working electrode and the counter electrode.

In embodiments, the liquid electrochemical memory device includes a current sensor. In embodiments, the liquid electrochemical memory device is configured so that the current sensor can detect a current flow through the working electrode. Thereby, on electro-dissolution of a bit, for example a layer, a current flow induced by the electro-dissolution may be detected. As the current flow may depend on the material, for example, conductive species included in the bit, for example in the layer, the current sensor may detect whether a first bit or a second bit is electro-dissolved. Furthermore, by sensing the current flow as dependent on time, a thickness of the first bit or the second bit may be detected. Thereby, the current sensor may be used for reading the bits stored in the memory region. The disclosed technology is however not limited to a current sensor. In embodiments, the liquid electrochemical memory device includes a voltage sensor. In embodiments, the liquid electrochemical memory device is configured so that the voltage sensor can detect a potential at the working electrode. Thereby, on electro-dissolution of a bit, for example a layer, a potential generated by the electro-dissolution may be detected. In embodiments, the control unit includes the current sensor or the voltage sensor. In particular embodiments, the control unit includes a charge sensor for sensing an amount of charge flow, that is, an integration of the current over time.

Any features of any embodiment of the first aspect may be independently as correspondingly described for any embodiment of any of the other aspects of the disclosed technology.

In a second aspect, the disclosed technology relates to a method for writing data in a liquid electrochemical memory device according to embodiments of the first aspect, the method including electrodepositing at least one of the two conductive species from the electrolyte thereby creating at least a bit in the memory region.

Any features of any embodiment of the second aspect may be independently as correspondingly described for any embodiment of any of the other aspects of the disclosed technology.

In embodiments, electrodepositing is performed by applying bias or current conditions to the working and counter electrodes so as to electrodeposit the at least one of the conductive species, for example a layer including the at least one of the conductive species, in the memory region, such as over a surface of the working electrode exposed to the memory region. In embodiments, applying bias or current conditions includes applying first bias or current conditions or applying second bias or current conditions. In embodiments, the method includes cyclically performing the steps of a) applying first bias or current conditions to the working and counter electrodes, thereby creating a first bit, for example a first layer in the memory region, the first bit including a first ratio of a concentration of first conductive species to a concentration of second conductive species; and b) applying second bias or current conditions to the working and counter electrodes, thereby depositing a second bit, for example a second layer in the working region, the second bit including a second ratio of a concentration of first conductive species to a concentration of second conductive species. Herein, the first ratio and the second ratio may be different. For instance, the first ratio may be lower than the second ratio by 0.1 or more. By cyclically performing the steps a) and b), a stack of alternating first and second bits, that is, a stack of alternating first and second layers, may be formed.

In embodiments, the first and second bias or current conditions are adapted so that there is a conventional current flow from the working electrode, via an external conductor, to the counter electrode. That is, electrons flow from the counter electrode, via the external conductor, to the working electrode. At the working electrode, the electrons may be transferred to the conductive species in the electrolyte, so that the conductive species may become reduced. On reduction, the conductive species may be deposited on the working electrode to form a bit. In embodiments, the first and second bias or current conditions may be applied by the application of a voltage or the induction of a current by the control unit. In embodiments, the first and second bias or current conditions are adapted so that the working electrode is a negative electrode and the counter electrode is a positive electrode. In embodiments, the first and second bias or current conditions include a negative, that is, reducing, potential at the working electrode and a positive, that is, oxidizing potential at the counter electrode.

In certain embodiments, the first bias or current conditions are adapted so that only second conductive species may be deposited and not first conductive species may be deposited. Herein, a reduction potential of the second conductive species may be higher than a reduction potential of the first conductive species. For example, applying the first bias or current conditions may include applying a first potential to the working electrode, wherein the first potential is higher (for example at least 0.1 V higher) than the reduction potential of the first conductive species, and lower (for example at least 0.1 V lower) than the reduction potential of the second conductive species.

In embodiments, the second bias or current conditions are adapted so that both the first conductive species and the second conductive species may be deposited. For example, applying the second bias or current conditions may include applying a second potential to the working electrode wherein the second potential is lower than the reduction potential of both the first and second conductive species. Advantageously, in these embodiments, the first ratio and the second ratio may be different.

The longer the bias or current conditions are applied, the more material may be deposited in the memory region, that is, the thicker a deposited layer may be. Hence, the composition of the deposited layer may depend on the bias or current conditions that are applied, and the thickness of the deposited layer may depend on the duration of the applied bias or current conditions.

In a third aspect, the disclosed technology relates to a method for reading data in a liquid electrochemical memory device according to any embodiment of the first aspect, the method including:

applying bias or current conditions to the working and counter electrodes so as to electro-dissolve material from the working electrode; and monitoring the amount of charge flowing through the working electrode or the voltage appearing at the working electrode during electro-dis solving.

In an embodiment of the third aspect, the disclosed technology relates to a method for reading data in a liquid electrochemical memory device according to embodiments of the first aspect, the method including: applying bias or current conditions to the working and counter electrodes so as to electro-dissolve material from the working electrode; and monitoring the current level or amount of charge flowing through the working electrode, or monitoring the voltage level appearing at the working electrode during electro-dissolving, and/or the amount of time certain current or voltage levels are maintained at the working electrode during electro-dissolving.

Any features of any embodiment of the third aspect may be independently as correspondingly described for any embodiment of any of the other aspects of the disclosed technology.

In embodiments of the third aspect, the disclosed technology relates to a method for reading data in a liquid electrochemical memory device according to embodiments of the first aspect, the method including: applying bias or current conditions to the working and counter electrodes so as to electro-dissolve material from the working electrode; and monitoring the current level or amount of charge flowing through the working electrode, or monitoring the voltage level appearing at the working electrode during electro-dissolving, and/or the amount of time certain current or voltage levels are maintained at the working electrode during electro-dissolving.

In embodiments, applying bias or current conditions to the working and counter electrodes so as to electro-dissolve material from the working electrode includes that a working electrode is a positive electrode and the counter electrode is a negative electrode. In embodiments, the bias or current conditions are applied by the control unit.

In embodiments, the applied bias or current conditions include that a positive voltage is applied to the working electrode. As a result of the applied bias or current conditions, material, for example conductive species included in bits, that is, layers at the working electrode may become oxidized and thereby electro-dissolve in the electrolyte. The oxidation may include that electrons are transferred from the material to the working electrode. Thereby, a conventional current flow may be induced from the counter electrode, via an external conductor, to the working electrode. That is, electrons flow from the working electrode, via the external conductive, to the counter electrode. The current flow may depend on the composition of the material, for instance on the electrode potential of the composition of the material.

In embodiments, the applied bias or current conditions include inducing a current to flow from the counter electrode to the working electrode. That is, electrons are induced to flow from the working electrode to the counter electrode. Thereby, the material may be oxidized. As a result, a voltage may be generated at the working electrode. The voltage that is generated may depend on the material that is oxidized, for instance on the reduction potential of the composition of the material.

Therefore, monitoring the current level or the voltage level may yield information on the type of material that is electro-dissolved. For instance, in embodiments including a stack of alternating first and second layers, the current level or the voltage level may be different during electro-dissolution of the first layer than during electro-dissolution of the second layer. Monitoring the amount of time certain current or voltage levels are maintained may yield information about an amount of the material that is electro-dissolved. That is, the monitoring of the amount of time may yield information on a thickness of a bit or, for example, a thickness of a layer. Thereby, in embodiments including the stack of alternating first and second layers, the thicknesses of each of the alternating first and second layers may be detected, and thereby the data stored in the stack of alternating first and second layers may be read.

In embodiments, the applied bias or current conditions are constant. However, in different embodiments, the applied bias or current conditions may be modulated to increase a rate of reading. That is, read algorithms wherein the applied bias or current conditions are switchable may be envisaged to increase the rate of reading. For example, when one of the first or second layers electro-dissolves very slowly, the applied bias or current conditions may be adapted to increase the rate of electro-dissolution.

In a fourth aspect, the disclosed technology relates to a method for producing a liquid electrochemical memory device according to embodiments of the first aspect, including: providing a memory region for storing at least two bits, the memory region having a first volume, and a working electrode exposed to the memory region, providing a liquid electrolyte region fluidically connected to the memory region, the liquid electrolyte region having a second volume larger than the first volume, and a counter electrode exposed to the liquid electrolyte region, providing an electrolyte in the memory region and in the liquid electrolyte region, the electrolyte including at least two conductive species, and providing a control unit for biasing the working electrode and the counter electrode.

Any features of any embodiment of the fourth aspect may be independently as correspondingly described for any embodiment of any of the other aspects of the disclosed technology.

In embodiments, the control unit is provided in a substrate, for example in a semiconductor substrate. In embodiments, the control unit is provided using commonly known metal-oxide-semiconductor (CMOS) technologies. In embodiments, the memory region is provided over, for example, on top of the substrate including the control unit.

The memory region may be provided using deposition and patterning techniques well known to a person skilled in the art. For example, deposition and patterning techniques known from back-end-of-line (BEOL) technology may be used. In embodiments, a metallization layer may be deposited over the semiconductor substrate. The working electrode may be provided on top of the metallization layer. In embodiments, the metallization layer may be patterned, thereby forming at least one metallization plug. In these embodiments, the working electrode may be provided, for example, deposited on a metallization plug. Providing the working electrode may be done by techniques known for a person skilled in the art, such as by depositing and patterning a conductive material for forming the working electrode. In embodiments, an intermetallic dielectric (IMD) layer may be deposited on the conductive layer. In embodiments, for instance, a container such as a channel may be etched through this IMD layer thereby exposing the working electrode. In these embodiments, the container may be the memory region. The deposition of the IMD layer and the etching through the IMD layer may be done using back-end-of-line (BEOL) techniques well known for a person skilled in the art. In embodiments, in the memory region and on top of the IMD a liquid electrolyte region is provided. In embodiments, the liquid electrolyte region is formed by depositing a dielectric layer and patterning this layer, thereby forming the liquid electrolyte region. In embodiments, the liquid electrolyte may be provided by filling the liquid electrolyte region and the memory region with the liquid electrolyte.

In certain embodiments, the method includes hermetically sealing the memory region and the liquid electrolyte region. In these embodiments, the liquid electrochemical memory device produced by the method includes a hermetically sealed memory region and liquid electrolyte region. Advantageously, the hermetic sealing may prevent leaking of the electrolyte, for example, to other parts of the liquid electrochemical memory device. Advantageously, the hermetic sealing may ensure that the liquid electrolyte is not contaminated, for example, by oxygen. In embodiments wherein the liquid electrolyte includes a very low amount of water, the hermetic sealing may prevent contamination of the liquid electrolyte by water.

In embodiments, the hermetic sealing may be provided by providing a hermetic capping layer on top of the liquid electrolyte region. In embodiments, the hermetic capping layer may be bonded to the substrate using die-to-die techniques or die-to-wafer or wafer-to-wafer bonding techniques. For the hermetic sealing, sealing techniques used for MEMS applications where also typically a cavity is present may be used.

The disclosed technology will now be described by a detailed description of several embodiments of the disclosed technology. It is clear that other embodiments of the disclosed technology can be configured according to the knowledge of persons skilled in the art without departing from the true spirit or technical teaching of the disclosed technology.

Example 1: Liquid Electrochemical Memory Device Including One Memory Region

Figure 1:
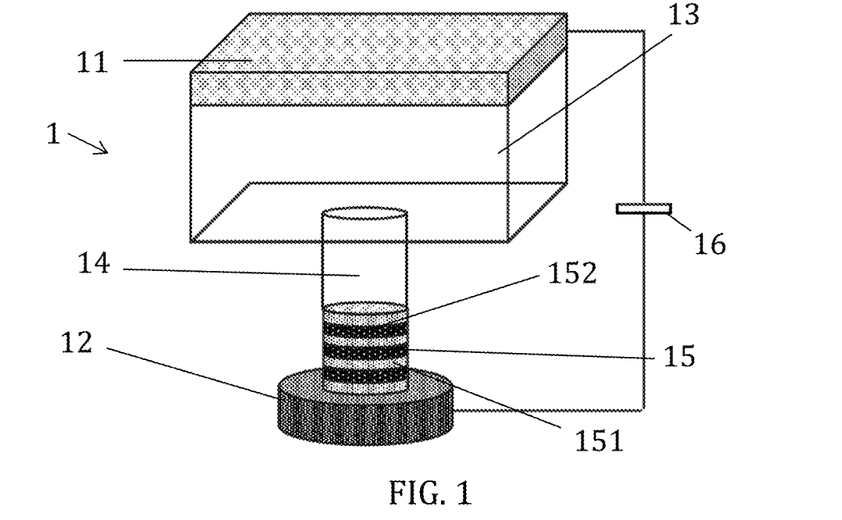
FIG. 1 is a schematic representation of a liquid electrochemical memory device according to embodiments of the disclosed technology.

Reference is made to FIG. 1, which is a schematic representation of a liquid electrochemical memory device 1 according to embodiments of the disclosed technology. The liquid electrochemical memory device 1 includes a liquid electrolyte region 13 to which a counter electrode 11 is exposed. The liquid electrochemical memory device 1 further includes a memory region 14 that in this example is a channel, and that is fluidically coupled to the liquid electrolyte region 13. A liquid electrolyte is present in the memory region 14 and in the liquid electrolyte region 13. The liquid electrolyte includes at least two conductive species. A working electrode 12 is exposed to the memory region 14. A control unit 16 is electrically connected to working electrode 12 and the counter electrode 14 for biasing the working electrode 12 and the counter electrode 14. A first width of the memory region 14, perpendicular to a direction from the working electrode 12 to the counter electrode 11, is smaller than a second width of the liquid electrolyte region 13, perpendicular to the direction. Furthermore, in this example, a second volume of the liquid electrolyte region is larger than a first volume of the memory region. In this way, the second volume of liquid electrolyte present in the memory region 14 and in the liquid electrolyte region 13 may be sufficiently large, whereas a distance between the working electrode 12 and the counter electrode 11 may remain small. Furthermore, in this example, because a width of the memory region 14 is relatively small, also a bit, for example, layer deposited in the memory region 14, is relatively small. Therefore, for the electrodeposition of a bit, for example, layer including conductive species with a particular width, the amount of conductive species from the electrolyte needed for the electrodeposition may be relatively small. Thereby, in this example, electrodeposition may not significantly influence a concentration of the conductive species in the electrolyte. Therefore, a rate of electrodeposition may remain similar, for example large, even after electrodeposition of a plurality of bits.

In this example, the liquid electrochemical device 1 furthermore includes a stack of layers 15 in the memory region 14, over, that is, on top of, the working electrode 12. The stack of layers 15 includes alternating first layers 151 and second layers 152. Each layer of layers 151 and of layers 152 corresponds to a bit of data.

Figure 2:
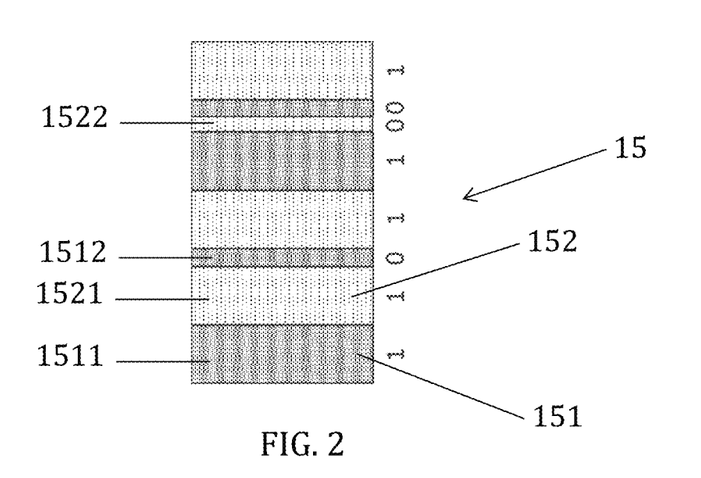
FIG. 2 is a schematic cross-sectional representation of a stack of layers in a memory region of a liquid electrochemical memory device according to embodiments of the disclosed technology.

Reference is made to FIG. 2, which is a schematic cross-sectional representation of the stack of layers 15. In this example, the stack of layers 15 includes eight alternating first layers 151 and second layers 152. Each of the first layers 151 may have a first thickness 1511 or a second thickness 1512, wherein the first thickness 1511 is, in this example, 3.5 times as large as the second thickness 1512. The disclosed technology is, however, not limited thereto. Each of the second layers 152 may have a first thickness 1521 or a second thickness 1522, wherein the first thickness 1521 is, in this example, 3.5 times as large as the second thickness 1522. The disclosed technology is, however, not limited thereto. In this example, the first layers with first thickness 1511 have a same thickness as the second layers with first thickness 1521, and the first layers with second thickness 1512 have a same thickness as the second layers with second thickness 1522. The disclosed technology is, however, not limited thereto, and the thicknesses may be different. In this example, the first thickness 1511 or 1521 corresponds to unity (a logic one) in a binary numerical system, that is, indicated by the zeros and ones at the right of each layer 1511 and 1521 and 1512 and 1522. In this example, the second thickness 1512 or 1522 corresponds to logic zero in a binary numerical system. Thereby, the stack of layers 15 corresponds to (from top to bottom) 10011011 in binary data.

Figure 3:
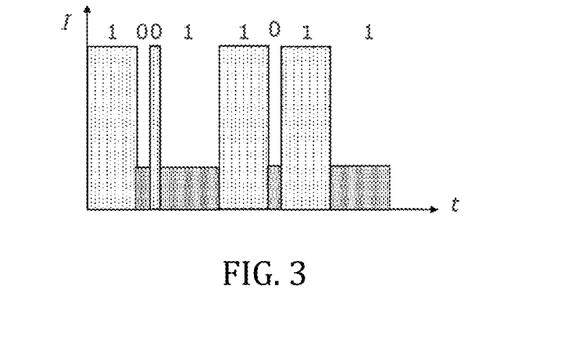
FIG. 3 is a plot of current as a function of time, generated during electro-dissolution of a stack of layers in a memory region of a liquid electrochemical memory device according to embodiments of the disclosed technology.

Bias or current conditions may be applied to the working electrode 12 and the counter electrode 11 so as to electro-dissolve material, that is, the stack of layers 15, from the working electrode 12. In this example, a positive voltage is applied to the working electrode 12, so that the layers 151 and 152 are electro-dissolved, from top to bottom, from the stack of layers 15. The electro-dissolution results in a flow of electrons, that is, a current through the working electrode 12. The current may be detected as a function of time, for instance using a current sensor. Reference is made to FIG. 3, which is a plot of the current I as a function of time t, generated during the electro-dissolution of the stack of layers 15. Herein, the current through the working electrode 12 has been monitored as a function of time. When first layers 151 are electro-dissolved, the current is larger than when the second layers 152 are electro-dissolved. Thereby, it is possible to distinguish between electro-dissolution of first layers 151 and second layers 152. Layers with the first thickness 1511 and 1521 take a larger amount of time to electro-dissolve than layers with the second thickness 1512 and 1522. Thereby, it is possible to distinguish, by sensing the current, between electro-dissolution of layers with the first thickness 1511 and 1521 and layers with the second thickness 1521 and 1522. Hence, by sensing the current that is generated on application of the bias or current conditions so as to electro-dis solve material from the working electrode 12, the bits stored in the stack of layers 15 may be read, indicated by the zeros and ones.

Example 2: Liquid Electrochemical Memory Device Including a Plurality of Memory Regions Reference is made to FIG. 4, which is a schematic vertical cross-sectional representation of a liquid electrochemical memory device according to embodiments of the disclosed technology. In this example, the liquid electrochemical memory device includes a plurality of memory regions 14, that is, an array of memory regions 14. In this example, the liquid electrochemical memory device includes a corresponding number of working electrodes 12, each exposed to a different memory region 14. In this example, the liquid electrolyte region 13 includes a single liquid electrolyte region 13 fluidically coupled to the plurality of memory regions 14. The working electrodes 12 and counter electrode 11 are connected to a control unit 16. In this example, each of the plurality of working electrodes 12 may be individually addressable by the control unit 16.

Figure 4:
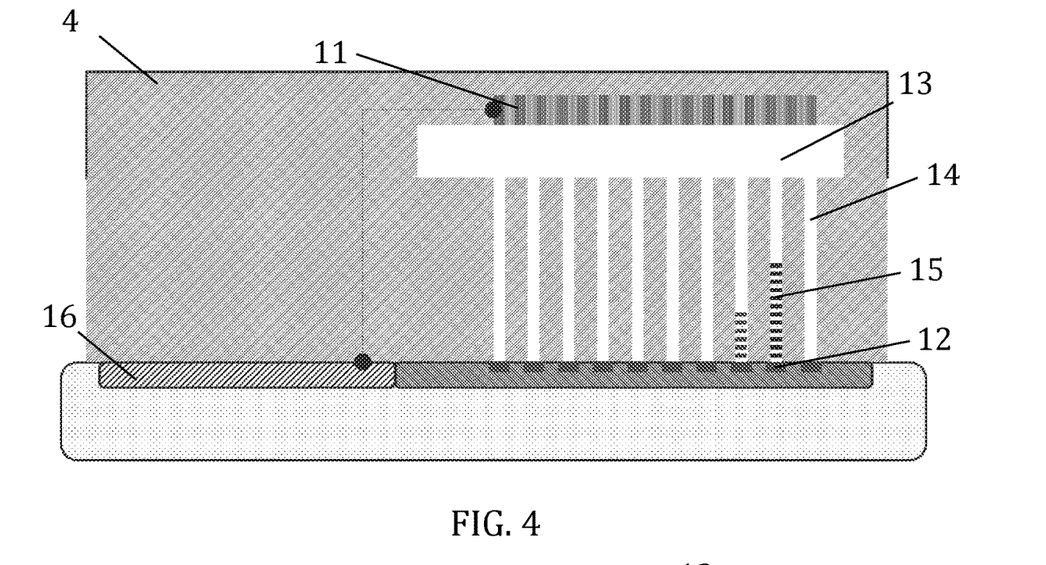
FIG. 4 is a schematic vertical cross-sectional representation of a liquid electrochemical memory device including a plurality of memory regions according to embodiments of the disclosed technology.

Bits, that is, a stack of layers 15, may be present in the memory regions 14, that is, over the working electrode 12 of each of the memory regions 14. In this example, each of the memory regions 14 is a nanochannel that has a width of 20 nm, and a length of 3.3 µm. For example, the layers may have an average thickness of 2 nm. Thereby, in this example, 1650 layers may be deposited in each of the memory regions 14, corresponding to 1650 bits.

In this example, the liquid electrolyte region 13 and the memory region 14 are hermetically sealed. Thereby, no liquid electrolyte included in the liquid electrolyte region 13 and in the memory region 14 may leak out of the liquid electrochemical memory device, and furthermore, the liquid electrolyte may not become contaminated. For this, a hermetic capping layer 4 has been obtained over the liquid electrolyte region 13. Herein the hermetic capping layer 4 includes the counter electrode 11.

Example 3: Hermetically Capped Liquid Electrochemical Memory Device

Figure 5:
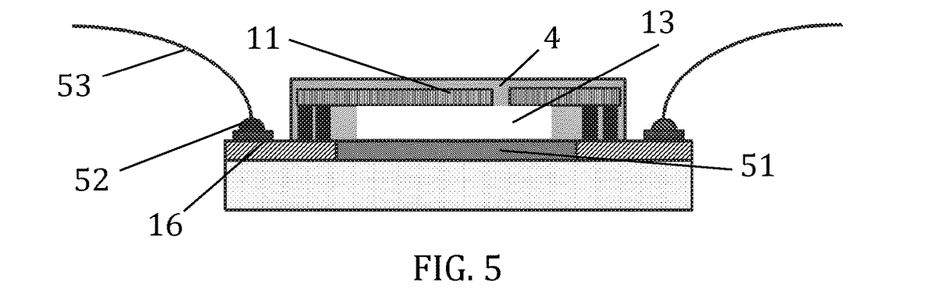
FIG. 5 is a schematic vertical cross-sectional representation of a liquid electrochemical memory device including a hermetic capping according to embodiments of the disclosed technology.

Reference is made to FIG. 5, which is a schematic vertical cross-sectional representation of a liquid electrochemical memory device according to embodiments of the disclosed technology. In this example, the liquid electrochemical memory device includes a layer 51 including a plurality of memory regions and working electrodes exposed to the memory regions (memory regions and working electrodes are not shown).

In this example, a control unit 16 and a plurality of memory regions and working electrodes may be obtained on a substrate, for example, a single silicon chip. For this, for example, a modified CMOS process may be used. A hermetic capping 4 may be attached to the substrate for instance using die-to-die or die-to-wafer techniques.

In this example, the hermetic capping 4 has a smaller width than the substrate, so that bonding pads 52 on the substrate are exposed for electrically connecting a wire 53 to the control unit 16. This is however not necessary, and alternatively, the hermetic capping layer 4 may include bonding pads 52 that are, for example, via a conductor through the hermetic capping layer 4, electrically connected to the control unit 16.

In this example, the hermetic capping layer 4 includes the counter electrode 11 electrically connected to the control unit 16. Therefore, the counter electrode 11 in the capping hermetic layer 4 may be biased by the control circuit 16.

Example 4: Liquid Electrochemical Memory Device Including a Barrier

Figure 6:
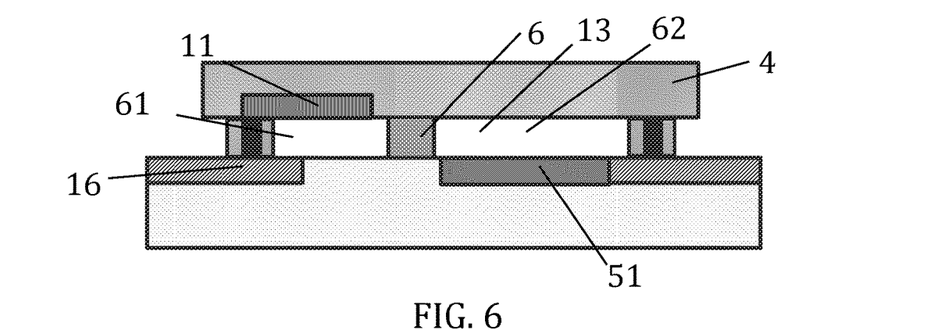
FIG. 6, is a schematic vertical cross-sectional representation of a liquid electrochemical memory device including a barrier according to embodiments of the disclosed technology.

Reference is made to FIG. 6, which is a schematic vertical cross-sectional representation of a liquid electrochemical memory device according to embodiments of the disclosed technology. In this example, the liquid electrochemical memory device includes a barrier 6 in the liquid electrolyte region 13. The barrier 6 is permeable to at least one ion, for example, protons, but not to another ion. In this example, the barrier 6 is not permeable to the conductive species. The electrolyte filling the liquid electrolyte region in this example includes a first electrolyte 61 contacting a counter electrode 11 in a hermetic capping layer 4 and a second electrolyte 62 contacting the working electrode in the memory regions (not shown in detail, but present in layer 51). In this example, the second electrolyte 62 includes the conductive species.

Figure 7:
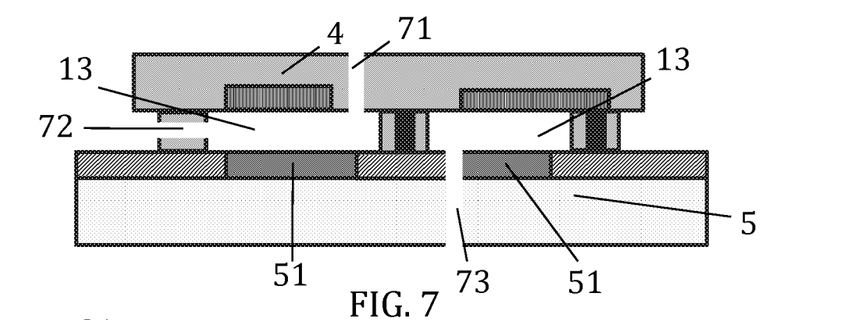
FIG. 7 is a schematic vertical cross-section of a liquid electrochemical memory device according to embodiments of the disclosed technology, including holes for filling a liquid electrolyte region and a memory region with liquid electrolyte.

Example 5: Filling the Liquid Electrolyte Region and the Memory Region with Liquid Electrolyte Reference is made to FIG. 7, which is a schematic vertical cross-section of a liquid electrochemical memory device according to embodiments of the disclosed technology. For filling the liquid electrolyte region 13 and the memory region, included in the layer 51, with liquid electrolyte, a hole may be provided in a cap 71, in a support of the cap 72, or in the substrate 73. Via the hole 71, 72, or 73, the liquid electrolyte region 13 and the memory region may be filled with the liquid electrolyte, for instance by capillary force or injection with a needle. Advantageously, when a liquid electrolyte with a low vapor pressure is used, filling may be performed under vacuum. The vacuum may prevent trapping of air bubbles in the liquid electrolyte region 13 and the memory region. The hole 71, 72, or 73 may, after the filling, be sealed by application of a sealing material on top of the hole 71, 72, or 73. Alternatively, a sealing film may be deposited over the hole 71, 72, or 73, wherein the sealing film may, for instance, cover a surface including the hole 71, 72, or 73. In embodiments wherein a sealing film is deposited with a technique requiring high deposition temperatures, the liquid electrolyte may have a boiling temperature at least that of the deposition temperature. In embodiments wherein a sealing film is deposited with a technique requiring low pressure, the liquid electrolyte may have a low vapor pressure. In embodiments wherein the liquid electrolyte is non-aqueous, the vacuum process may additionally serve to remove water, oxygen and other contaminants from the electrolyte.

Figure 8:
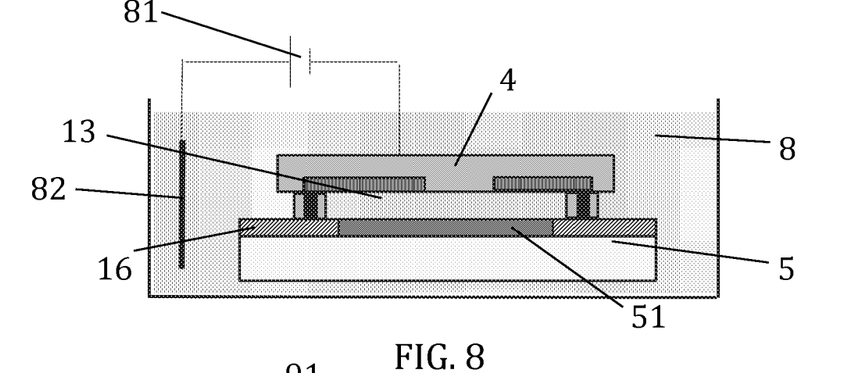
FIG. 8 is a schematic vertical cross-section of a liquid electrolyte memory device according to embodiments of the disclosed technology, submerged in a bath including liquid electrolyte.

Reference is made to FIG. 8, which is a schematic vertical cross-section of a liquid electrolyte memory device according to embodiments of the disclosed technology. In this example, a substrate 5 includes a layer 51 including the memory regions and the working electrodes, and further includes a control unit 16. The substrate 5 may be submerged in a bath 8 including the liquid electrolyte. Subsequently, a hermetic capping layer 4 is submerged and positioned on top of the substrate 5. Thereby, liquid electrolyte may become trapped in the liquid electrolyte region 13 and the memory regions. The hermetic capping layer 4 and the substrate 5 may be connected to a voltage source 81 that is also connected to a counter electrode 82 that is also submerged in the bath 8. A voltage may then be applied, so that the hermetic capping layer 4 and the substrate 5 act as working electrode. Thereby, a metallic film, for example including conductive species in the liquid electrolyte in the bath 8, may be electro-deposited on the outer surface of the hermetic capping layer 4 and the substrate 5. The metallic film may hermetically seal and mechanically connect the hermetic capping layer 4 and the substrate 5 to each other, thereby forming a joined hermetic capping layer 4 and substrate 5, that is, a liquid electrochemical memory device. In addition, mechanical pressure and thermal treatment may be applied to the joined hermetic capping layer 4 and substrate 5 after removal from the bath 8, to improve mechanical and electrical connection between the hermetic capping layer 4 and the substrate 5.

Figure 9:
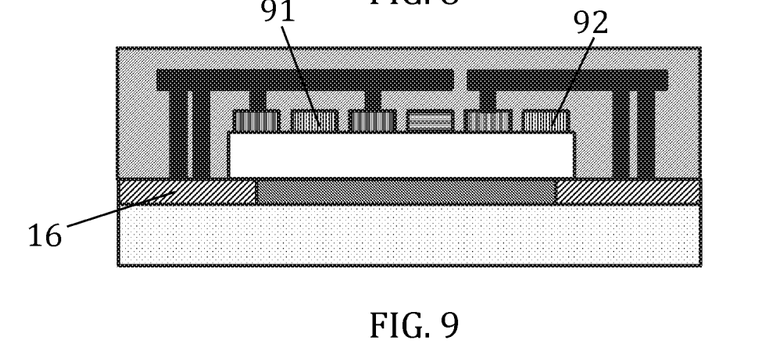
FIG. 9 is a schematic vertical cross-section of a liquid electrochemical memory device including counter electrodes including conductive species according to embodiments of the disclosed technology.

Example 6: Liquid Electrochemical Memory Device Including Counter Electrodes Comprising Conductive Species Reference is made to FIG. 9, which is a schematic vertical cross-section of a liquid electrochemical memory device according to embodiments of the disclosed technology. In this example, at least one of the counter electrodes includes conductive species 91. From the counter electrode including conductive species 91, conductive species may be electro-dissolved in the liquid electrolyte. In addition, conductive species may be electro-deposited from the liquid electrolyte onto the counter electrode including the conductive species 91. Thereby, the counter electrode including the conductive species 91 may control the concentration of conductive species in the electrolyte. In addition, the liquid electrochemical memory device may include a probing electrode 92. The probing electrode 92 may detect the concentration of conductive species in the liquid electrolyte. If, for instance, a concentration of conductive species in the liquid electrolyte is below a threshold, a control unit 61 may induce the counter electrode including the conductive species 91 to electro-dissolve conductive species into the liquid electrolyte. If, for instance, a concentration of conductive species in the liquid electrolyte is above a threshold, a control unit 61 may induce the counter electrode including the conductive species 91 to electro-deposit conductive species from the liquid electrolyte on the surface of the counter electrode including the conductive species 91.

Example 7: Liquid Electrochemical Memory Device Including a Helping Electrode

Figure 10A:
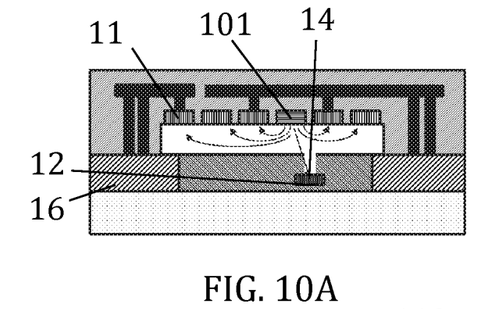
FIG. 10A and FIG. 10B are schematic vertical cross-sections of a liquid electrochemical memory device including a helping electrode according to embodiments of the disclosed technology.

Reference is made to FIG. 10A, which is a schematic vertical cross-section of a liquid electrochemical memory device according to embodiments of the disclosed technology. In this example, the liquid electrochemical memory device includes a helping electrode 101. The helping electrode 101 includes protective species. The protective species have a reduction potential that is higher (for example, at least 0.1 V higher) than a reduction potential of the conductive species in the electrolyte. The liquid electrochemical memory device may be powered down and switched in retention mode wherein no external power source may be available. Before the liquid electrochemical memory device is powered down, the helping electrode 101 may be biased by the control unit 16 so that protective species are electro-dissolved in the liquid electrolyte. Subsequently, the protective species may be electro-deposited on electrodes of the liquid electrochemical memory device, such as on a working electrode 12 exposed to a memory region 14, and on a counter electrodes 11. The arrows in FIG. 10A indicate that protective species move from the helping electrode 101 to the electrodes that are to be protected. Thereby, a protective film may be formed over exposed surfaces of the electrodes. The protective film may prevent galvanic corrosion of the electrodes.

Figure 10B:
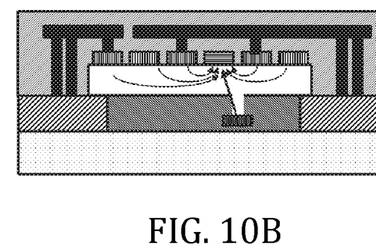

Reference is made to FIG. 10B. For instance, after turning on the liquid electrochemical memory device, the protective species may be electro-dissolved from the working electrode 12 and the counter electrodes 11, and electro-deposited on the helping electrode 101. The arrows in FIG. 10B indicate that protective species move from the electrodes that are to be protected to the helping electrode 101.

Figure 11:
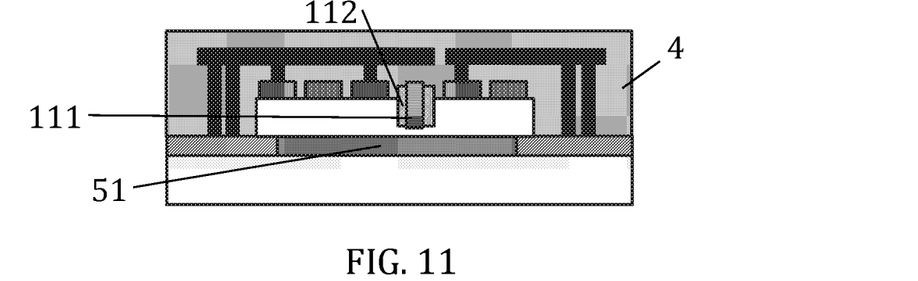
FIG. 11 is a schematic vertical cross-section of a liquid electrochemical memory device including a reference electrode connected to a hermetic capping layer according to embodiments of the disclosed technology.

Example 8: Liquid Electrochemical Memory Device Including a Reference Electrode Reference is made to FIG. 11. In embodiments, the liquid electrochemical memory device according to embodiments of the disclosed technology may include a reference electrode 111 for sensing a potential in the liquid electrolyte. The reference electrode 111 may be located in the proximity of a memory region (not shown, but included in layer 51). In this example, the reference electrode 111 is connected to a hermetic capping layer 4. In this example, the reference electrode 111 is relatively thick, so that at least part of the reference electrode 111 is close to the memory region. The sidewalls of the reference electrode 111 that may be not close to the memory region may be covered by an insulating material 112. Thereby, only a potential in the proximity of the memory region may be sensed by the reference electrode 111.

Figure 12:
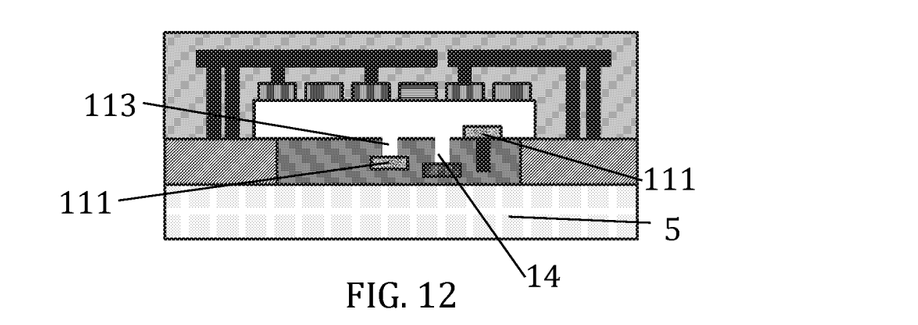
FIG. 12 is a schematic vertical cross-section of a liquid electrochemical memory device including a reference electrode connected to a substrate according to embodiments of the disclosed technology.

Reference is made to FIG. 12. In another example, the reference electrode 111 may be located at an end of a channel 113, wherein the channel 113 may for instance have the same dimensions of a memory region 14. For instance, the channel 113 may be formed simultaneously with the memory region 14. Alternatively, the reference electrode 111 may be located on top of a surface 5 of the substrate.

Example 9: Stacked Liquid Electrochemical Memory Device

Figure 13:
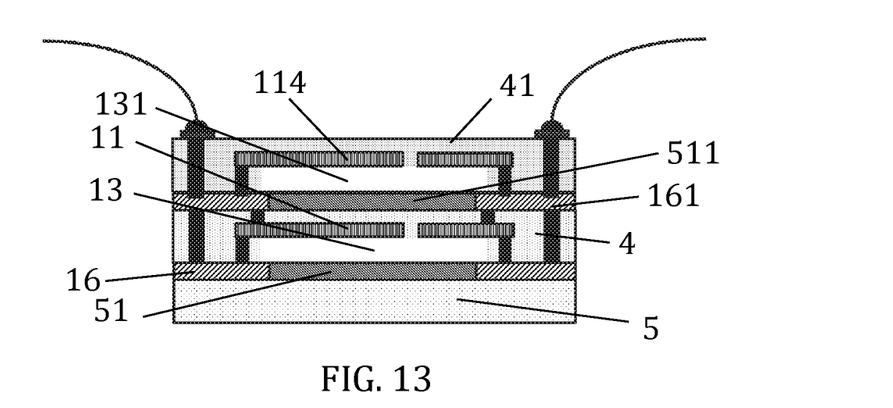
FIG. 13 is a schematic vertical cross-section of a stacked liquid electrochemical memory device according to embodiments of the disclosed technology.

Reference is made to FIG. 13. In a further example, the liquid electrochemical memory device is a stacked liquid electrochemical memory device. Thereby, a bit density of the liquid electrochemical memory device may be increased. In this example, on top of a silicon substrate 5 there is a layer 51 including an array of memory regions and working electrodes, and a control unit 16. On top of the substrate 5, a first hermetic capping layer 4 may be provided including a first liquid electrolyte region 13 and a first counter electrode 11. A further layer 511 including memory regions, working electrodes and a separate control unit 161 may be provided on top of the first capping layer 4. The separate control unit 161 is however not required, and instead, a single control unit 16 may be used to control all electrodes of the stacked liquid electrochemical memory device. On the further layer 51, a second capping layer 41 may be provided, the second capping layer 41 including a second electrolyte region 131 and a second counter electrode 114. The electrolyte in the two liquid electrolyte regions 13 and 131 may be the same or may be different. Alternatively, the liquid electrolyte regions 13 and 131 may be fluidically connected to each other. Thereby, the electrolyte may move freely between the liquid electrolyte regions 13 and 131.

It is to be understood that although certain embodiments, specific constructions and configurations, as well as materials, have been discussed herein for devices according to the disclosed technology, various changes or modifications in form and detail may be made without departing from the scope and spirit of the disclosed technology. For example, any formulas given above are merely representative of procedures that may be used. Functionality may be added or deleted from the block diagrams and operations may be interchanged among functional blocks. Steps may be added or deleted to methods described within the scope of the disclosed technology.

What is claimed is:

1. A liquid electrochemical memory device comprising:
   a memory region configured to store at least two bits, the memory region having a first volume;
   a liquid electrolyte region fluidically connected to the memory region, the liquid electrolyte region having a second volume larger than the first volume;
   a working electrode exposed to the memory region;
   a counter electrode exposed to the liquid electrolyte region;
   an electrolyte filling the memory region and the liquid electrolyte region, in physical contact with the working electrode and the counter electrode, the electrolyte comprising at least two conductive species; and
   a control unit configured to bias the working electrode and the counter electrode, wherein the counter electrode comprises the at least two conductive species.

2. The liquid electrochemical memory device according to claim 1, further comprising a plurality of memory regions, each configured to store at least two bits, and a corresponding number of working electrodes, each exposed to a different memory region.

3. The liquid electrochemical memory device according to claim 2, wherein the liquid electrolyte region comprises a single liquid electrolyte region fluidically coupled to the plurality of memory regions.

4. The liquid electrochemical memory device according to claim 1, wherein one of the conductive species is copper and another of the conductive species is cobalt, tin or nickel.

5. The liquid electrochemical memory device according to claim 1, wherein the memory region comprises a container.

6. The liquid electrochemical memory device according to claim 5, wherein the working electrode is at a first side of the container, and the container is fluidically connected to the liquid electrolyte region at a second side of the container opposite to the first side.

7. The liquid electrochemical memory device according to claim 1, wherein the memory region has a width of from 10 to 100 nm.

8. The liquid electrochemical memory device according to claim 1, wherein a concentration of one of the conductive species is at least ten times higher than a concentration of another of the conductive species.

9. The liquid electrochemical memory device according to claim 1, wherein a concentration of one of the conductive species is at least a hundred times higher than a concentration of another of the conductive species.

10. The liquid electrochemical memory device according to claim 1, further comprising a barrier between the counter electrode and the working electrode, wherein the barrier is permeable to at least one ion and not permeable to another ion.

11. The liquid electrochemical memory device according to claim 1, wherein the electrolyte further comprises a protective species having a reduction potential that is higher than each reduction potential of the at least two conductive species.

12. The liquid electrochemical memory device according to claim 1, further comprising a stack of alternating first layers and second layers over the working electrode.

13. A method of writing data in a liquid electrochemical memory device according to claim 1, the method comprising electrodepositing at least one of the two conductive species from the electrolyte thereby creating at least a bit in the memory region.

14. A method of reading data in a liquid electrochemical memory device according to claim 1, the method comprising:
applying bias or current conditions to the working electrode and counter electrode so as to electro-dissolve material from the working electrode; and
monitoring the amount of charge flowing through the working electrode or the voltage appearing at the working electrode during electro-dis solving.

15. A method of producing a liquid electrochemical memory device, the method comprising:
providing a memory region configured to store at least two bits, the memory region having a first volume;
exposing a working electrode to the memory region;
providing a liquid electrolyte region fluidically connected to the memory region, the liquid electrolyte region having a second volume larger than the first volume;
exposing a counter electrode to the liquid electrolyte region;
providing an electrolyte in the memory region and in the liquid electrolyte region, the electrolyte comprising at least two conductive species; and
providing a control unit configured to bias the working electrode and the counter electrode, wherein the counter electrode comprises the at least two conductive species.

16. A liquid electrochemical memory device comprising:
a plurality of memory regions, each of the plurality of memory regions configured to store at least two bits, each of the plurality of memory regions having a first volume;
a single liquid electrolyte region fluidically connected to the plurality of memory regions, the single liquid electrolyte region having a second volume larger than the first volume;
a corresponding number of working electrodes, each exposed to a different memory region;
a counter electrode exposed to the single liquid electrolyte region;
an electrolyte filling the plurality of memory regions and the single liquid electrolyte region, in physical contact with the working electrodes and the counter electrode, the electrolyte comprising at least two conductive species; and
a control unit configured to bias the working electrodes and the counter electrode.

17. The liquid electrochemical memory device according to claim 16, wherein one of the conductive species is copper and another of the conductive species is cobalt, tin or nickel.

18. A liquid electrochemical memory device comprising:
a memory region for storing at least two bits, the memory region having a first volume;
a liquid electrolyte region fluidically connected to the memory region, the liquid electrolyte region having a second volume larger than the first volume;
a working electrode exposed to the memory region;
a counter electrode exposed to the liquid electrolyte region;
an electrolyte filling the memory region and the liquid electrolyte region, in physical contact with the working electrode and the counter electrode, the electrolyte comprising at least two conductive species;
a control unit configured to bias the working electrode and the counter electrode; and
a barrier between the counter electrode and the working electrode, wherein the barrier is permeable to at least one ion and not permeable to another ion.

19. The liquid electrochemical memory device according to claim 18, wherein one of the conductive species is copper and another of the conductive species is cobalt, tin or nickel.

20. The liquid electrochemical memory device according to claim 18, wherein the memory region has a width of from 10 to 100 nm.

* * * * *